United States Patent [19]

Iwamatsu

[11] Patent Number: 4,902,897
[45] Date of Patent: Feb. 20, 1990

[54] ION BEAM GUN AND ION BEAM EXPOSURE DEVICE

[75] Inventor: Seiichi Iwamatsu, Suwa, Japan

[73] Assignee: Seiko Epson Corporation, Tokyo, Japan

[21] Appl. No.: 107,424

[22] Filed: Oct. 13, 1987

[30] Foreign Application Priority Data

| Oct. 13, 1986 | [JP] | Japan | 61-242389 |
|---|---|---|---|
| Oct. 13, 1986 | [JP] | Japan | 61-242390 |
| Nov. 2, 1986 | [JP] | Japan | 61-278192 |
| Nov. 6, 1986 | [JP] | Japan | 61-264241 |
| Nov. 12, 1986 | [JP] | Japan | 61-268950 |
| Nov. 13, 1986 | [JP] | Japan | 61-270759 |
| Nov. 14, 1986 | [JP] | Japan | 61-271409 |
| Nov. 14, 1986 | [JP] | Japan | 61-271411 |
| Nov. 20, 1986 | [JP] | Japan | 61-277483 |
| Nov. 21, 1986 | [JP] | Japan | 61-278199 |
| Jan. 16, 1987 | [JP] | Japan | 62-007536 |
| Jan. 16, 1987 | [JP] | Japan | 62-007532 |
| Jan. 19, 1987 | [JP] | Japan | 62-009767 |
| Jan. 19, 1987 | [JP] | Japan | 62-009768 |

[51] Int. Cl.$^4$ .............................................. H01J 27/00
[52] U.S. Cl. .............................. 250/423 R; 250/505.1
[58] Field of Search ........... 250/505.1, 423 R, 492.24; 315/111.81; 313/359.1, 360.1, 363.1

[56] References Cited

U.S. PATENT DOCUMENTS

| 3,519,873 | 7/1970 | O'Keeffe | 250/492.24 |
|---|---|---|---|
| 3,895,234 | 7/1975 | O'Keeffe et al. | 250/492.24 |
| 4,227,090 | 10/1980 | Amboss | 250/492.24 |
| 4,694,222 | 9/1987 | Wakalopulos | 315/111.81 |
| 4,695,732 | 9/1987 | Ward | 250/505.1 |

Primary Examiner—Bruce C. Anderson
Attorney, Agent, or Firm—Blum Kaplan

[57] ABSTRACT

An ion beam exposure device including an ion beam source and an ion beam mask is provided. The ion beam source is formed from a thin film which is disposed between a vacuum side and a gas side. The film is in the form of a plate having a fine wire buried therein or a crystal boundary formed therein. An electric field supplied to the plate ionizing the gas passing from the gas source side of the plate to the vacuum side. A patterned ion mask may be formed directly on the ion beam source, thereby creating an ion beam gun which emits an ion beam in the desired pattern.

42 Claims, 9 Drawing Sheets

ION BEAM GUN AND ION BEAM EXPOSURE DEVICE

BACKGROUND OF THE INVENTION

This invention relates in general to an ion beam gun and an ion beam exposure device, and in particular to an ion beam exposure device utilizing a gas ion beam gun and a mask.

Ion beam guns making use of gas ionization are well known in the art. One such prior art device applies an electrical field to a tungsten pin which is wetted on its top surface by condensed hydrogen and emits an atomic or molecular ion. In a second prior art device an electrical field is applied to a metal film having a small pin hole. The electrical field is generated by applying hydrogen gas emitted at the pin hole to the metal layer.

A stencil mask has been used as an ion beam exposure mask during ion beam exposure of the prior art ion beam guns. The stensile mask is prepared by selectively etching an extremely thin film of tungsten, molybdenum or the like, thereby producing holes in the form of the desired pattern on the film. Another known mask includes a membrane of silicon, $Al_2O_3$, polyimide and the like. The masks may also be a metal film which blocks the ion beam from passing disposed on one of the membranes in the form of desired patterns.

Figure 1:
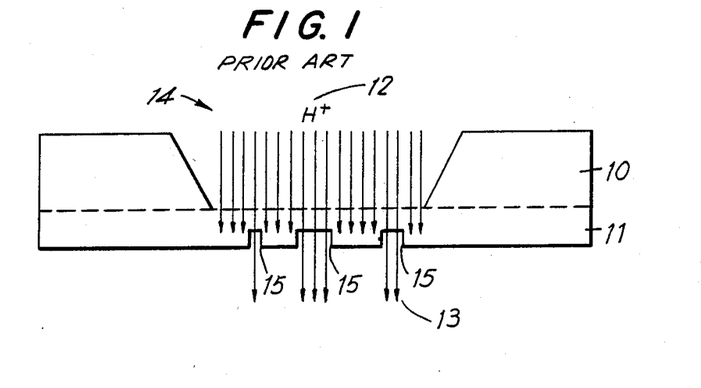
FIG. 1 is a cross sectional view of a prior art ion beam exposure mask.

Reference is made to FIGS. 1 and 2 wherein a prior art ion beam 14 as disclosed in J. L. Bartelt, "Masks Ion Beam Lithography: The Following Generation New Technology", *Solid State Technology*, August 1986, pp. 44-51 is shown. FIG. 1 shows a channeling mask of a monocrystalline silicon substrate 10 having a silicon epitaxial layer 11 formed thereon. A plurality of grooves 15 are partially formed on one surface of substrate 10 to provide regions of relatively lesser thickness forming a pattern. Grooves 15 are of different depths and widths to form a variety of segments of the desired patterns. A proton (H+) 12 on the substrate ide of epitaxial layer 11 is accelerated, and is radiated towards the epitaxial layer 11 which acts as a membrane so that some protons 12 are trapped between the monocrystal lattice 10 while selectively allowing an ion shower 13 to be emitted through grooves 15 in the form of the pattern. Ion shower 13 is emitted where grooves 15 occur because at grooves 15 silicon epitaxial layer 11 is relatively thin, thereby allowing ion beam exposure to occur.

Figure 2A:
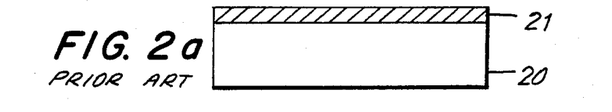
FIG. 2 is a method for preparing the prior art ion beam exposure mask.
Figure 2B:
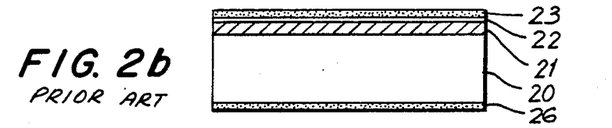
Figure 2C:
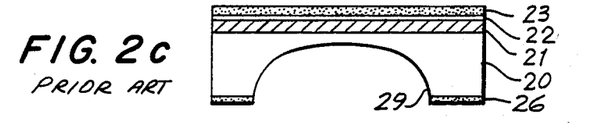

Ion beam exposure mask 14 is formed by growing a silicon epitaxial layer 21, which is doped with boron, on one surface of a monocrystalline silicon substrate 20 to a thickness of about 2 $\mu$m (FIG. 2a). An $SiO_2$ film 22 and an $Si_3N_4$ film 23 are formed on silicon epitaxial layer 21 by chemical vapor deposition. An $Si_3N_4$ film 26 is then formed on the second or back surface of monocrystalline silicon substrate 20 (FIG. 2b). $Si_3N_4$ film 26 is etched and the remaining portion serves as a mask for etching monocrystalline substrate 20 (FIG. 2c).

Figure 2D:
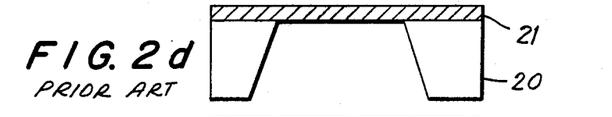
Figure 2E:
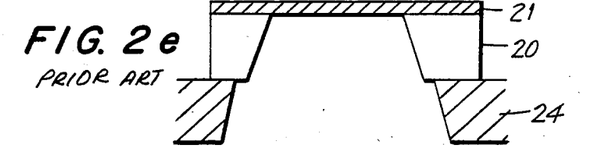
Figure 2F:
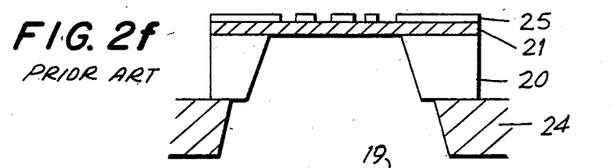
Figure 2G:
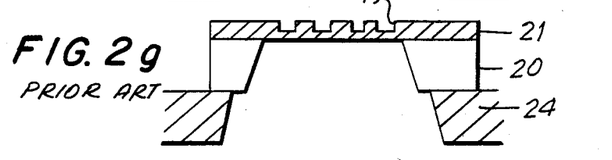

Anisotropy etching is performed on the entire substrate to remove a portion of monocrystalline silicon substrate 20, $SiO_2$ film 22 and $Si_3N_4$ films 23 and 26 (FIG. 2d). Monocrystalline silicon substrate 20 is then affixed to a pyrex glass ring 24 (FIG. 2e). A resist layer 25 is selectively formed on silicon epitaxial layer 21 by anisotropy etching (reactive ion etching; RIE or the like) forming a pattern of grooves 19 in silicon epitaxial layer 21 which removes resist layer 25 (FIG. 2g).

Figure 3:
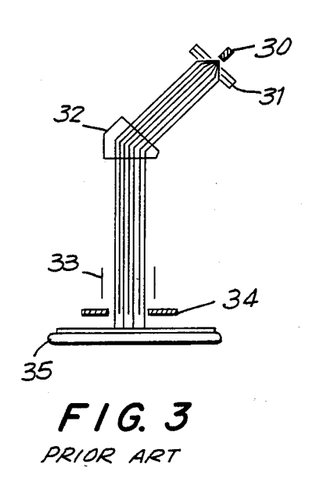
FIG. 3 is an illustration of the proximity exposure prior art ion beam exposure device.
Figure 4:
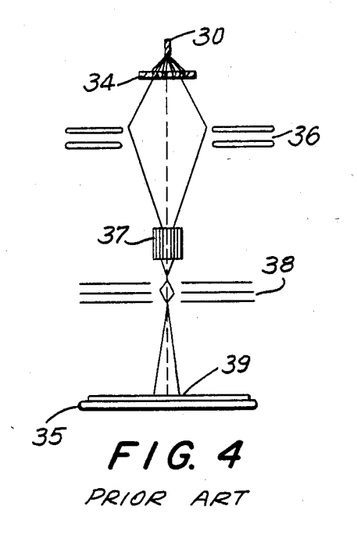
FIG. 4 is an illustration of the mask irradiated prior art ion beam exposure device.

FIGS. 3 and 4 show an ion beam gun and ion beam exposure mask as disclosed in J. N. Randall, "Prospects For Printing Very Large Scale Integrated Circuits With Masked Ion Beam Lithography", *J. Vac. Sci. Technol.*, A4 (3), May/June 1986, American Vacuum Society, pp. 777-783 are depicted. FIG. 3 shows the proximity exposure method of exposing the ion ray through the mask directly onto a wafer without distortion of size of the pattern using a parallel ion ray. An ion beam 30a emitted from an ion beam source 30 passes through an ion lens 31, a magnetic mass filter 32 and a deflection plate 33 through an exposure mask 34 onto a wafer 35. Ion beam 30a which passes through mask 34 produces the pattern of mask 34 on wafer 35.

FIG. 4 illustrates a method wherein ion beam 30a is radiated through a mask 34 almost at ion source 30 and is scaled down by an immersion lens 36 and passed through an octopole 37, a projecting lens 38 and an image reducer 39 adjacent to wafer 35. In this method the ion beam is masked into the pattern first and then passed through a series of beam changing devices prior to producing the pattern on the wafer.

These are the known prior art ion beam exposure devices and exposure methods currently in use. While these devices have been satisfactory, they suffer from the problem that the ion beam diameter of the ion beam gun varies with the diameter of the tungsten wire pin. Furthermore, the vacuum properties of the gun do not increase where a radio-active atmosphere is a vacuum. This is due to the fact that a liquified gas must be used in the tungsten wire pin method, and it is difficult to maintain vacuum properties equivalent to those obtained in the pin hole method.

It is possible to improve the parallel property of the ion beam with higher ion current values, yet it is difficult to obtain a large ion current. Thus, the ion current density is reduced during the developing of the point light source into a face light source. Therefore, the exposure time at the time of conducting the ion beam exposure methods becomes longer. This results in a decrease in productivity. Moreover, in the ion beam exposure mask there are problems because the thickness of the membrane cannot be easily controlled. Additionally, it is difficult to form an extremely thin membrane and if a thin membrane is formed it is difficult to handle because the membrane brakes easily. Finally, the prior art ion beam exposure masks cannot act as the ion source. Furthermore, in the proximity exposure method, the resolving power is low, thereby making it difficult to set the proximity gap. In the scale down projecting exposure method, the output is low.

Accordingly, it is desirable to provide an ion beam exposure device containing an ion beam gun and an ion mask which overcomes the shortcomings of the prior art devices described above.

SUMMARY OF THE INVENTION

Generally speaking, in accordance with the invention, an ion beam exposure device having an improved ion beam gun and an improved ion beam mask is provided. The ion beam source includes a thin film which is disposed between a gas and a vacuum. The film may be mounted on a pin hole plate or may be a fine wire within the plate. Alternatively, ions may be generated by a crystal defect in a monocrystalline film. An electric field is applied to the plate causing the gas to ionize passing from the gas source side of the plate to the vacuum side. Alternatively, ions in a plasma may be accelerated by high voltages. Finally, a patterned ion mask may be formed directly on an ion beam source, thereby creating an ion beam gun which emits an ion beam in the desired pattern.

The invention also includes improved ion beam exposure masks having a silicon carbide channelling mask layer. Ion beams may be generated by irradiating a conductive mask with ultra-violet rays.

Accordingly, it is an object of this invention to provide an improved ion beam exposure apparatus.

Another object of this invention is to provide an ion beam gun which produces an ion beam having good parallelism and a high ion current in the form of a pattern.

A further object of this invention is to provide an ion beam gun which provides an ion beam which does not increase in diameter as it travels in a high vacuum atmosphere.

Still another object of the invention is to provide an ion beam exposure mask having an extremely thin and uniform membrane.

Yet another object of this invention is to provide an ion beam exposure mask combined with an ion gun wherein the ion beam source is formed in a pattern.

Still a further object of this invention is to provide an ion beam exposure device and exposure method having high output, high resolving power, and high productivity, wherein the ion beam exposure pattern occurs in substantially the same pattern and size as the pattern and size of the ion beam mask.

Still other objects and advantages of the invention will in part be obvious and will in part be apparent from the specification and drawings.

The invention accordingly comprises the several steps and the relation of one or more of such steps with respect to each of the others, the apparatus embodying features of construction, combination and arrangement of parts which are adapted to effect such steps, and the article which possesses the characteristics, properties and relation of elements, all as exemplified in the detailed disclosure hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENT

Gases, such as hydrogen, helium, argon and the like are generally ionized in accordance with the invention. The ions are generated by passing the gas through a thin film such as palladium, titanium, tungsten and the like while applying an electrical field to the thin film. The gas is then ionized which is formed into an ion beam.

Figure 5:
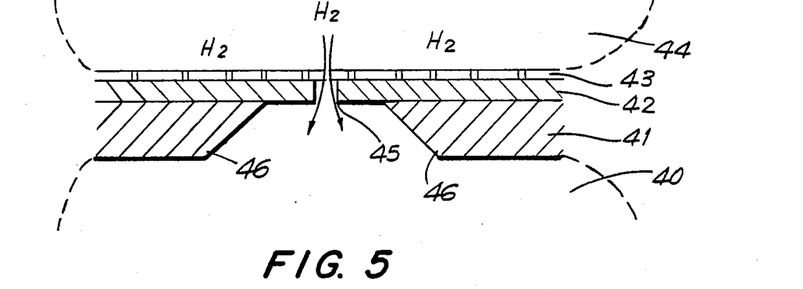
FIG. 5 is a sectional view of the ion source portion of an ion beam gun constructed in accordance with the invention.

More specifically, FIG. 5 shows an ion source of an ion beam gun constructed in accordance with the invention. A film 42 formed with a pin mole 45 is positioned on a back support sheet 41 so that pin hole 42 communicates with an opening 46 in support sheet 41. A palladium film 43, having a thickness of about 1 $\mu$m, is formed on the surface of pin hole film 42 covering pin hole 45.

When the surface of palladium film 43 contacts hydrogen gas in hydrogen containing side 44 and back sheet 41 is located at vacuum side 40, hydrogen gas ($H_2$) in hydrogen gas container side 44 is ionized as it is drawn through palladium film 43 to vacuum side 40 as hydrogen ions ($H^+$). It should be noted that a titanium film can be substituted for palladium. A tungsten film may also be utilized when argon gas is being ionized. It is useful to increase the pressure of hydrogen gas in order to increase the ion concentration and to cool the hydrogen gas in order to increase further the hydrogen gas concentration. It is known to emit gas ions by heating a super fine film such as a palladium film, titanium film, tungsten film or the like.

As shown in the present invention, since a barrier separates the vacuum from the gas supply, emitting of gas ions by the super fine film achieves a gas ionization of high efficiency without lowering the degree of the vacuum. Thus, a high density of gas ions can be emitted in a high vacuum condition.

Figure 6:
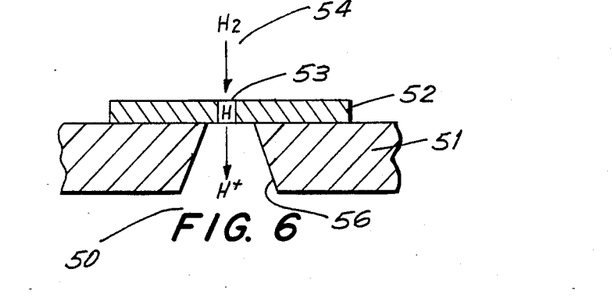
FIG. 6 is a sectional view of an embodiment of the ion source portion of an ion beam gun constructed in accordance with the invention.

Reference is now made to FIG. 6 wherein an ion source portion of an ion beam gun in accordance with the invention is shown. A super fine wire such as palladium, titanium, tungsten or the like is buried in the ion emission portion of an ion beam gun. In this embodiment, a plate 52 is deposited on the surface of a flange 51 having an opening 56a forming an ion beam gun body which is placed between a hydrogen gas source 54 and a vacuum 50. Palladium wire 53 is buried in plate 52 in the region adjacent opening 56. Plate 52 can be formed as a stick having a palladium wire core surrounded by iron which is stretched until the thickness becomes less than 0.1 μm. Abrasion cutting is performed to shape the stick into a plate. Hydrogen gas is contained in hydrogen gas container 54 which is under high pressure and is transmitted through palladium wire 53 and is drawn out as a proton (H+) into vacuum chamber 50 to form a proton beam.

Accordingly, because plate 52 separates vacuum 50 from gas container 54, when a plate combining a super fine wire made of palladium, titanium tungsten and the like is utilized as a tip portion of a gas ion beam gun, a gas ion beam can be emitted without lowering the degree of vacuum in the vacuum chamber. Palladium, titanium and the like transmit hydrogen gas while tungsten will transmit argon gas. Furthermore, as will be discussed below, these gases may also be transmitted through an interface such as a crystal grain boundary.

Figure 7:
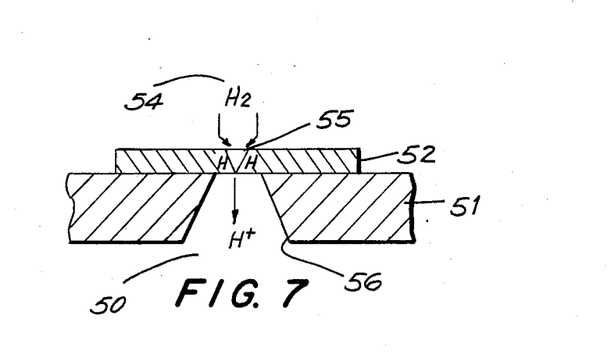
FIG. 7 is a sectional view of the ion source portion of an ion beam gun constructed in accordance with another embodiment of the invention.

In FIG. 7, a grain boundary of crystal 55 is substituted for the thin wire in FIG. 6. Plate 52 is placed on the upper surface of flange 51 and includes grain boundary of crystal 55 produced by fusion recrystallization using an ion beam or electron beam in the center of the plate. In this case, hydrogen gas permeates and is drawn out as a proton ion through opening 56 into vacuum chamber 50. It is useful to use an interface between two different substances acting as a grain boundary of crystal.

In accordance with these embodiments of the invention, by forming a gas ion beam gun wherein a gas chamber side and a vacuum chamber side are separated from each other by a barrier, the gas source remains in the gaseous state separated from the vacuum. Furthermore, a superfine gas ion beam of high ion density can be emitted efficiently without lowering the degree of vacuum in the vacuum chamber.

Figure 8:
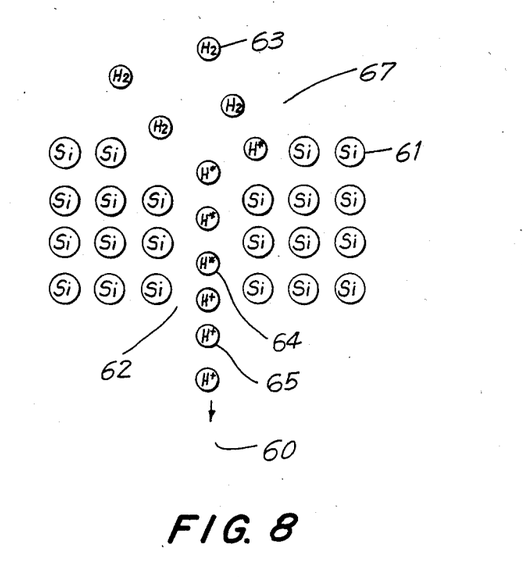
FIG. 8 is an illustration of the ion source portion of an ion beam gun constructed in accordance with a further embodiment of the invention.

In the embodiment of the invention shown in FIG. 8, an ion beam is emitted by passing an atom or molecule through a crystal defect in the lattice of a monocrystal. A monocrystal lattice 61 is formed with a dislocation or gap 62 in lattice 61. Hydrogen gas 63 may easily pass from a gas container 67 through gap 62 to a vacuum side 60 through this dislocation condition. The condition may occur either at the atomic, molecular or radical level. Thus, stray atoms or molecules can pass through gap 62 and are emitted one by one.

Hydrogen atoms, gas or liquid molecule 63 pass one by one through gap 62 formed by the crystal defect in monocrystal lattice 61. Monocrystal lattice 61 may be made of either Si, Au, W, Mo, Pt or the like. In the embodiment illustrated, hydrogen gas passes through gap 62 as radicals (H*) and are emitted as an ion beam 65 (H+) 329 in vacuum 60. Alternatively, the position of crystal defect 62 on the surface of monocrystal lattice 61 can be selected by an etching. Further, a helical dislocation may be used and is often useful when the formed defect is a crystal defect. The monocrystal can be formed from an alloy rather than a single metal, and a ceramic or high molecular weight compound are useful for the monocrystal material. When the tip structure of an atomic, molecular or ion beam gun is constructed in accordance with this embodiment, a super fine beam can be emitted in a high vacuum condition.

Figure 9:
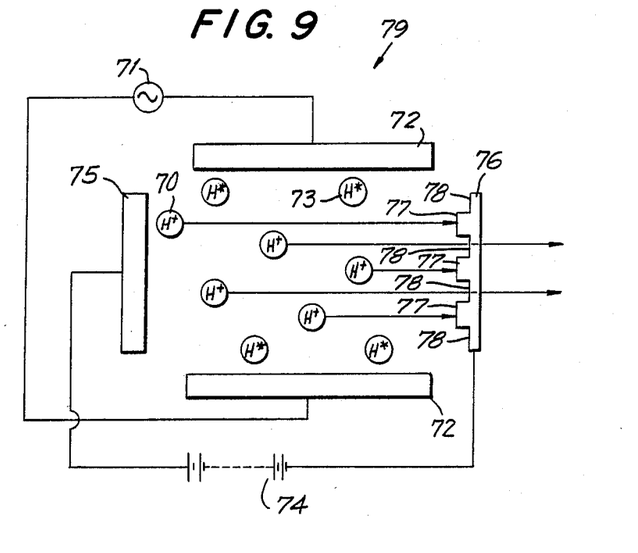
FIG. 9 is a top plan view of an ion beam gun and ion mask constructed in accordance with the invention.

A plasma acceleration surface source or an ion acceleration surface source transmitted through a monocrystal mask is shown in FIG. 9. An ion beam gun 79 includes a high frequency power source 71 coupled to a spaced pair of parallel grids 72. A high voltage power source 74 provides power to a high voltage grid 75 disposed perpendicularly to grids 72. A monocrystal mask 76 having thin portion 78 and thick regions 77 formed as a pattern on monocrystal mask 76, coupled to high voltage power source 74, is disposed parallel to grid 75 on the far side of grid 72.

Hydrogen gas flowing between grids 72 becomes a plasma 73 when high frequency power source 71 applies a high frequency to high frequency grid 72. Plasma 73 is ionized by high voltage grid 75 when voltage grid 75 receives a high voltage input from high voltage power source 74. Accelerated ions 70 are produced along a line perpendicular to monocrystal mask 76. Ions 70 move towards mask 76, but a portion of ions 70 are prevented from passing through mask 76 by thick monocrystal regions 77. Accordingly, ions 70 can only pass through thin portions 78. Thus, an ion beam surface source is formed as a pattern which is rectified by a back channel effect. The focus of such pattern shaped ion beam surface source can be formed on a light exposed surface by an optical system (not shown).

It is useful to trap and accelerate ions generated by a magnetic field such as a surface plasma source, or a surface ion source such as a Tokamak-type nuclear reactor. Accordingly, with an ion beam gun utilizing a surface source in accordance with the embodiment, a pattern shaped surface ion beam light source of high ion current density can be formed and an ion beam exposure of high productivity can be achieved.

Figure 10:
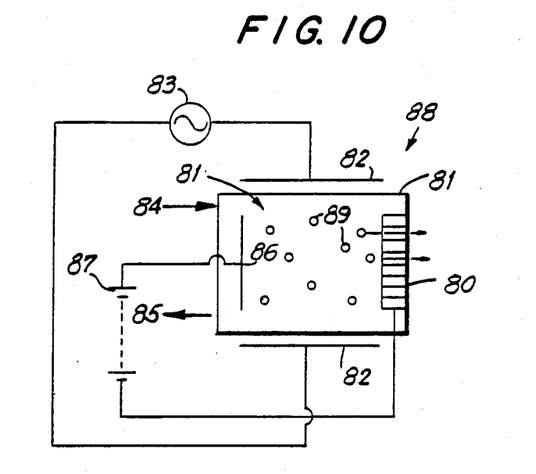
FIG. 10 is a top plan view of an ion beam gun and ion mask constructed in accordance with an embodiment of the invention.

An ion beam gun, generally indicated as 88 in FIG. 10 includes an acceleration plasma surface source 86 and a monocrystalline mask 80. A plasma container 81 is constructed of quartz or aluminum. A pair of RF electrodes 82 are connected to RF power source 83 and disposed on each side of plasma container 81. Electrodes 82 apply high frequency pulses to a gas 89 in plasma container 81. A gas inlet port 84 and a vacuum port 85 each communicate with plasma container 81. Acceleration electrode 86 made of aluminum is positioned within container 81 and is connected to an acceleration power source 87 for accelerating ions in plasma container 81. Monocrystalline film 80 is positioned within plasma container 81 opposite acceleration electrode 86. Film 80 may be a monocrystalline silicon film having a thickness of approximately 1 μm. An ion source is provided by drawing gas through inlet port 84 while controlling the pressure with vacuum port 85.

The ions accelerated in plasma container 81 are aligned unidirectionally by monocrystalline lattice 80 and are drawn by a channeling phenomenon created by ports 84 and 85. In addition, due to the port and container construction it is possible to accelerate the ions which are drawn from the plasma container 81 even more. Accordingly, the invention can produce a large number of aligned ions drawn up from a large port ion source upon applying a large current by drawing ion beams from a monocrystalline film. This results in a large ion current over a broad area as well as the emitting of an accurate parallel ion beam.

Figure 11:
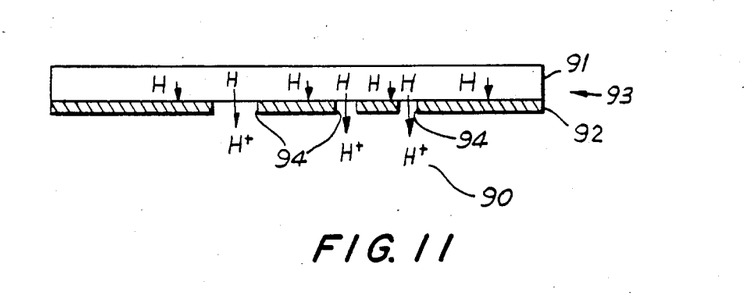
FIG. 11 is a sectional view of an ion beam gun and exposure mask constructed in accordance with another embodiment of the invention.

Generally, an ion beam exposure mask is utilized for masking ion beams which are emitted from the ion beam sources as described above. However, the mask itself may be used to produce an ion beam source generated in a pattern. FIG. 11 illustrate an ion beam exposure mask generally indicated as 93 which is used in an ion beam gun for emitting a patterned ion beam.

A titanium substrate including hydrogen emits hydrogen ions upon heating. A tungsten substrate including argon emits argon ions upon heating. A silicon nitride film serves for preventing hydrogen ions or argon ions from being emitted. Therefore, an ion beam exposure mask in accordance with the invention serves as both an ion source and a mask because the substrate allows transmittal of an ion source while the patterned silicon nitride film is formed on the substrate to prevent the transmission of hydrogen ions.

FIG. 9 illustrates such an embodiment in cross-section. A silicon nitride film 92 ($Si_3N_4$) having a thickness approximately between 0.1 and 1 $\mu m$ is formed on the surface of a titanium substrate 91 having a thickness of approximately 1 mm, by chemical vapor deposition (CVD). Silicon nitride film 92 is etched into a desired pattern having gaps 94 of various sizes, each gap exposing a portion of underlying substrate 91. Silicon nitride film 92 blocks emission of hydrogen ions 90. Upon heating, hydrogen ions ($H^+$) 90 are emitted from the titanium substrate through gaps 94 where silicon nitride film 92 is not formed on titanium substrate 91. Similarly, when a tungsten substrate is utilized, it is also possible to block an emitted argon gas ions.

As mentioned above, in accordance with the invention, an ion beam exposure mask which is made of a thick substrate may also serve as the ion source. This has the advantage that it is now possible to omit the use of a thin membrane film as a mask. This in turn eliminates damage which results for example, from the problems inherent in handling a thin film. Furthermore the use of a thick substrate as an ion source and mask facilitates manufacture of the device.

Additionally, in this embodiment, the nitride films are formed on the substrate in the pattern form. A titanium nitride film may be formed when a titanium substrate is used. In this case, the process of patterning a titanium nitride (TiN) film on the titanium substrate includes the steps of providing a titanium substrate having a thickness of approximately 1 mm, exposing the titanium substrate in an $NH_3$ atmosphere under a high temperature, forming a TiN film having a thickness of 500 to 1000 Å on the titanium substrate and forming patterns by selectively etching the film to construct the desired pattern. Accordingly, it is also possible to substitute a monocrystalline titanium substrate for a titanium substrate.

Additionally, the titanium nitride film may be formed on the backside or sides of the titanium substrate. Similarly, a palladium (Pd) film may be formed on both surfaces or one surface of the titanium substrate. A palladium (Pd) film having a thickness of approximately 1 mm may be utilized as the substrate. As with the titanium film, the palladium membrane substrate allows transmittal of hydrogen. A palladium nitride film (PdN) or silicon nitride film (SiN) having a thickness of 0.1 $\mu m$ which prevents the transmission of hydrogen is formed on a surface of the palladium membrane substrate in a pattern. This makes it possible to emit the ion beams in a desired pattern. Therefore, when applying a positive voltage to the substrate made of titanium, tungsten, palladium or the like, ion beams such as hydrogen ions or argon ions are emitted. Furthermore, each ion blocking nitride film may be selectively formed on a substrate surface in a pattern, or may be formed by selectively nitriding parts of the substrate surface.

A frame made of metal, glass or ceramic may be included in the substrate for improving the strength of the substrate. When a titanium substrate and a nitride film ion beam exposure mask are used, the invention has the advantage that it is possible to manufacture the masks easily while using the mask itself as the hydrogen ion beam source. When palladium film is the film membrane which is heated at the surface while applying a subtle rear gas pressure, a hydrogen gas is transmitted. The nitride film formed on the palladium film blocks the transmission of the hydrogen. Therefore, by patterning the nitride film, hydrogen gas is emitted on applying a positive voltage to the palladium film in a desired pattern of a nitride film. Additionally, nitride films other than palladium nitride or silicon nitride may be utilized as the nitride film.

Reference is now made to a method for forming an exposure mask in accordance with the invention is shown. A film pattern is prepared by selectively forming thick and thin portions of film which permits selective transmission or blocking of ions in accordance with the varied thickness of the film. A process for making a thin membrane film which has a high ion transmitting rate is described in connection with FIG. 12.

Figure 12A:
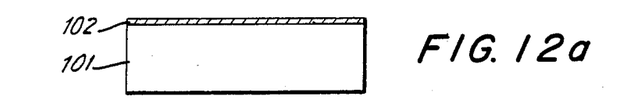
FIG. 12 is a sectional view of an ion source and enclosure mask combination in accordance with the invention.
Figure 12B:
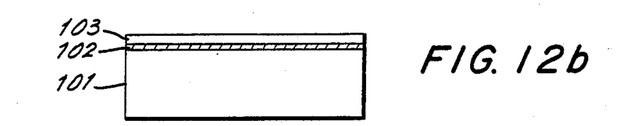
Figure 12C:
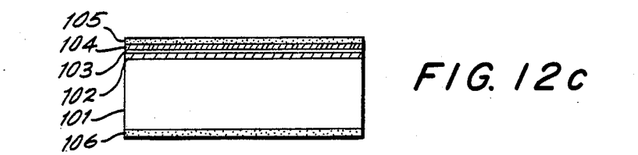

An SiC monocrystalline film 102 having a thickness of 0.1 $\mu m$ is formed on the upper surface of a monocrystalline silicon substrate 101 by the epitaxial process (FIG. 12a). A monocrystalline silicon epitaxial film 103 having a thickness of approximately 1 $\mu m$ is laminated on the monocrystalline film 102 (FIG. 12b). An $Si_3N_4$ film 104 is formed on silicon film 103 and an $SiO_2$ film 105 is laminated on film 104. A second $Si_3N_4$ film 106 is laminated on the lower surface of monocrystalline silicon layer 101 (FIG. 12c).

Figure 12D:
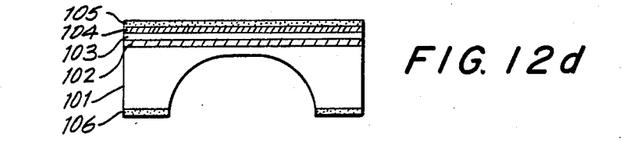
Figure 12E:
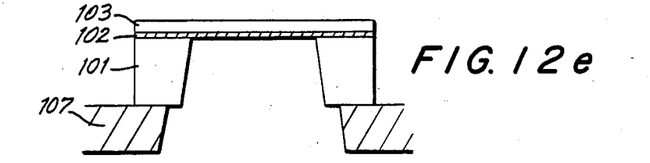
Figure 12F:
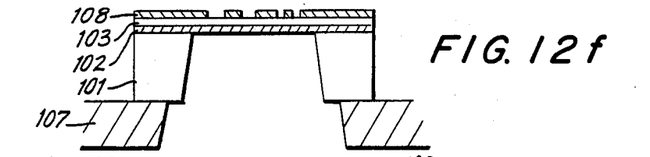
Figure 12G:
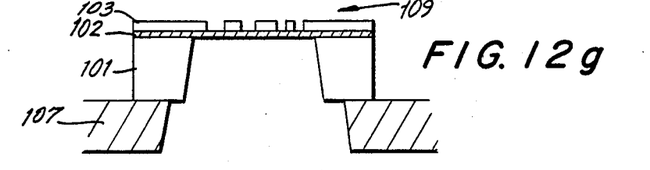

A pattern is etched on $Si_3N_4$ film 106 on the rear side to permit removal of a portion of substrate 101 (FIG. 12d). Remaining substrate 101 is then positioned on a pyrex ring 107 and $Si_3N_4$ film 105, $SiO_2$ film 104, and $Si_3N_4$ film 106 are removed to expose silicon layer 103 (FIG. 12e). An ion beam resist layer 108 is coated on silicon epitaxial layer 103. After the exposure and development of the ion beam, an SiC channelling mask 109 in the form of the desired pattern is formed by using patterned ion beam resist 18 as a mask to etch silicon epitaxial layer 103 utilizing reactive ion etching (RIE) (FIG. 12g). When such an SiC channelling mask in accordance with the invention is used, a very thin membrane film can be uniformly made.

FIG. 13 illustrates the process for manufacturing a patterned ion beam exposure mask in accordance with another embodiment of the invention. An Si substrate 201 of N-type monocrystalline silicon (FIG. 13a) is prepared. A resist film 202 is deposited on Si substrate 201 (FIG. 13b). Resist film 202 is directly exposed and developed by an ion beam to form a patterned resist 203 (FIG. 13c) which serves as a mask and Si substrate 201 is anisotropically etched by reactive ion etching or the like to form an etched pattern 204 (FIG. 13d). An SiC monocrystal film 205 or a boron doped Si epitaxial film is formed on Si substrate 201 in etched pattern 204 by the epitaxial process (FIG. 13e).

Figure 13A:
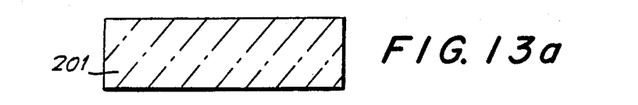
FIG. 13 is a method for preparing an ion beam exposure mask in accordance with the invention.
Figure 13B:
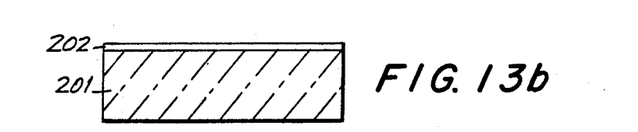
Figure 13C:
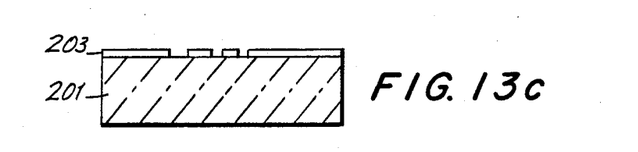
Figure 13D:
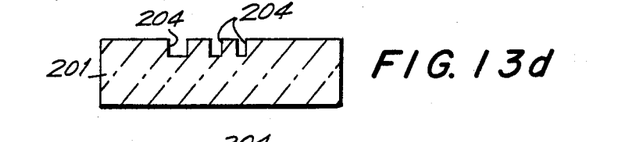
Figure 13E:
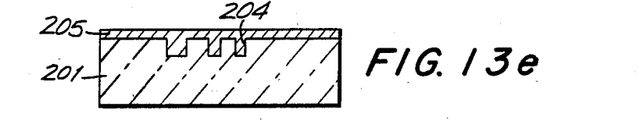
Figure 13F:
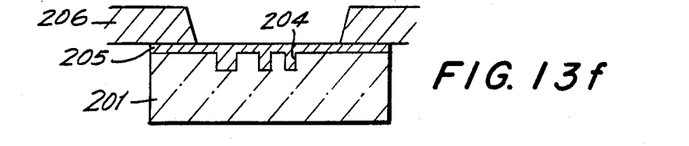
Figure 13G:
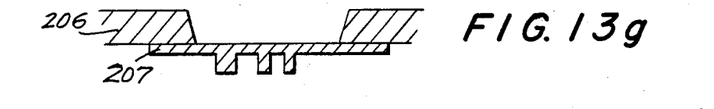
Figure 14:
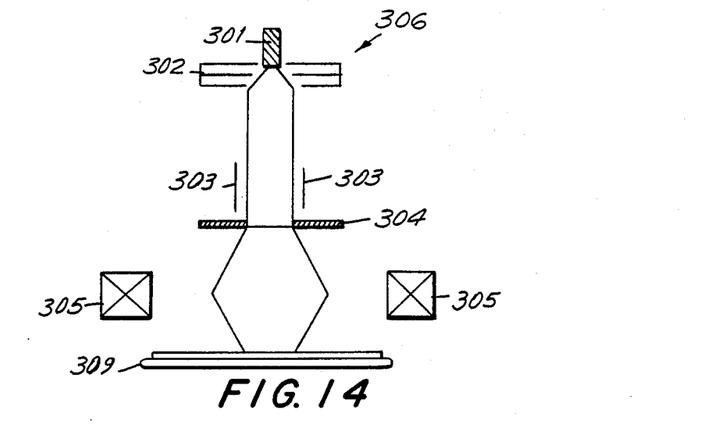
FIG. 14 is a sectional view of an ion beam exposure device constructed in accordance with the invention.

The mask is assembled by mounting substrate 201 with SiC pattern 205 on a pyrex ring 206 with SiC film 205 on ring 206 (FIG. 13f). Si substrate 201 is then removed from the rear side, forming a channelling mask 207 (FIG. 13g). The process of removing Si substrate 201 includes the steps of abrading the Si film approximately 50 $\mu m$ using mechanical abrading members, and chemically removing the remaining Si film until reaching the SiC epitaxial layer 205 utilizing a KOH solution or the like. Since SiC film or boron doped Si film is not affected by the KOH etching solution, this is efficiently conducted.

This process for manufacturing the ion beam exposure mask according to the invention is advantageous in that it is now possible to form a very thin membrane film easily. It is also possible to prepare a channelling mask having excellent resolution utilizing a single crystal film.

An ion beam exposure apparatus in accordance with the invention will now be described. The ion beam gun and ion beam exposure mask described may be utilized in the exposure apparatus. In this exposure apparatus, a projective lens is positioned between the exposure mask and the wafer. Parallel ion beams are irradiated towards the mask and the patterned irradiated ion beams are then projected onto the wafer through the projective lens which reduces the size of the projected pattern to correspond to the actual mask pattern size.

FIG. 12 is a schematic view of an ion beam exposure apparatus 306. He+ ions or H+ ions are output from an ion source 301 and pass through an ion lens 302. The ions are output as a parallel ion beam. The parallel ion beams are deflected in the X and Y directions and magnified by a deflection plate 303. The magnified ion beams are selectively passed through a pattern mask 304. The image of mask 304 is projected onto a wafer 309 through a projecting lens 305 which reduces the projected ion beam pattern to the same size as the actual mask pattern. An electrostatic lens or a magnetic field lens may be used for projecting lens 305.

As mentioned above, an ion beam exposure apparatus prepared in accordance with the invention projects a pattern of ion beams in the form of an image onto the wafer at the same size as the actual mask pattern. This method has the advantage of a high pass rate and high resolution. Additionally, best use is made of the deep focus step of the ion beam exposure and a proximity gap can be easily set.

Figure 15:
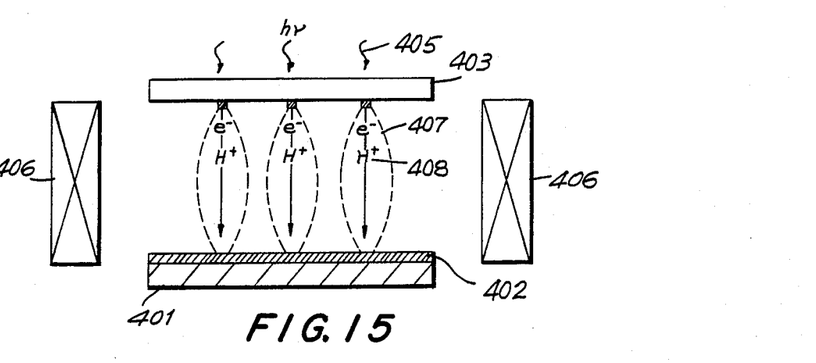
FIG. 15 is a sectional view of an ion beam exposure apparatus constructed in accordance with the invention.

Another example of an ion beam exposure apparatus and exposure method in accordance with the invention is shown in FIG. 15. The method collectively exposes a surface to ion beams. Generally, a cesium film is formed in a pattern on a glass mask surface. By irradiating the back side of the glass mask with ultraviolet rays the patterned cesium film selectively emits beams of electrons. The beams of emitted electrons in turn irradiate a gas such as hydrogen or helium ionizing the electrons. The ions converge and the converged ions irradiate toward a material surface to be exposed.

In the schematic view in FIG. 15, a resist film 402 is formed on a silicon wafer 401; the material to be exposed. A glass mask 403 is disposed opposite silicon wafer 401. A patterned cesium film 404 is deposited on glass mask 403. The back of glass mask 403 is irradiated by ultraviolet light rays 405 to excite cesium electrons 407 which are emitted. Electrons 407 excite hydrogen gas introduced into a vacuum formed between film 402 and mask 403 to form hydrogen ions, i.e. protons 408. A magnetic lens 406 disposed about the region between mask 403 and film 402 accelerates and converges protons 408, thereby exposing resist film 402 to an ion beam. Because the collective ion beam exposure method is used, high productivity is obtained.

Another ion beam exposure apparatus and the method for exposing a material according to the invention are shown in FIG. 16. Generally, metallic pattern films such as chrome or tungsten are formed in series on an insulating substrate such as quartz. The metallic film is covered with a protective film such as a silicon oxide ($SiO_2$) film forming a mask. The mask is used to generate ion beams for exposing a wafer.

Figure 16A:
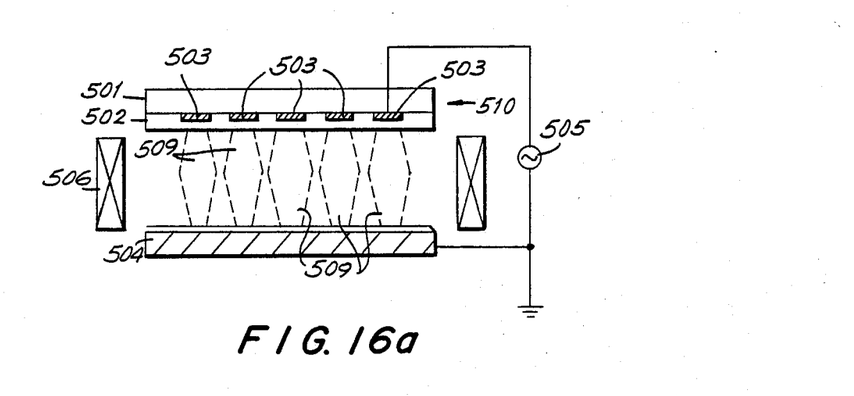
FIG. 16 is a sectional view of an ion beam exposure apparatus constructed in accordance with an embodiment of the invention.

A patterned metallic film 503 is selectively formed on the surface of a quartz substrate 501. The resulting surface is covered with a silicon oxide ($SiO_2$) film 502 forming a mask 510. A high frequency power source 505 applies a high frequency to patterned metallic film 503 with a plurality of gaps 512. Plasma ion 509 are generated in the pattern of mask 510. An electrostatic lens 506 disposed about the region between mask 510 and wafer 504 accelerates plasma ions 509 and projects them in the pattern of mask 510 onto a wafer 504 which is also coupled to power source 505. Accelerated ions 509 expose silicon wafer 504. This method is called the positive ion beam exposure method.

Figure 16B:
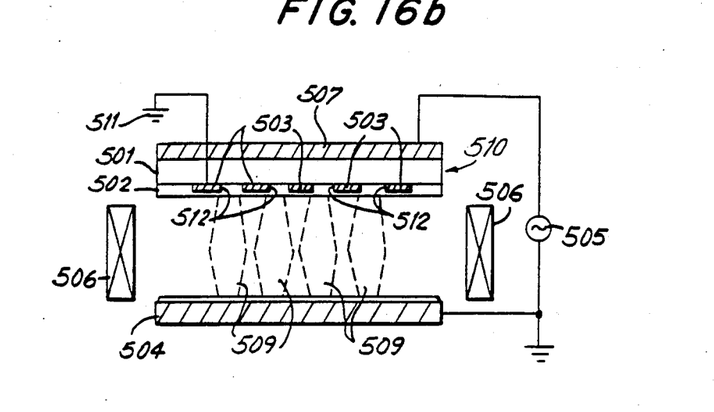

FIG. 16b shows a negative ion beam exposure method for forming an inverted image using a mask similar to the above structure. The structure of this embodiment is substantially the same as the above embodiment with a metallic plate electrode 507 disposed on the back side of mask 510 and metallic film 503 is grounded at ground 511. When a high frequency power source 505 is applied to metallic plate 507 and the pattern of metallic film 503 is grounded, plasma ions are generated in gaps 512 in metallic film pattern 503. Ions 509 are than accelerated and projected by electrostatic lens 506 onto silicon wafer 504 at the same size of the actual mask pattern.

As shown by the invention, a mask which has the same structures as that used in light exposure (e.g. exposure to ultraviolet light rays) can also be used for ion beam exposure. Therefore, a mask can easily be prepared using ion beam exposure which has significant benefits over the preparation of a mask using the conventional ion beam exposure method which is quite difficult.

Figure 17:
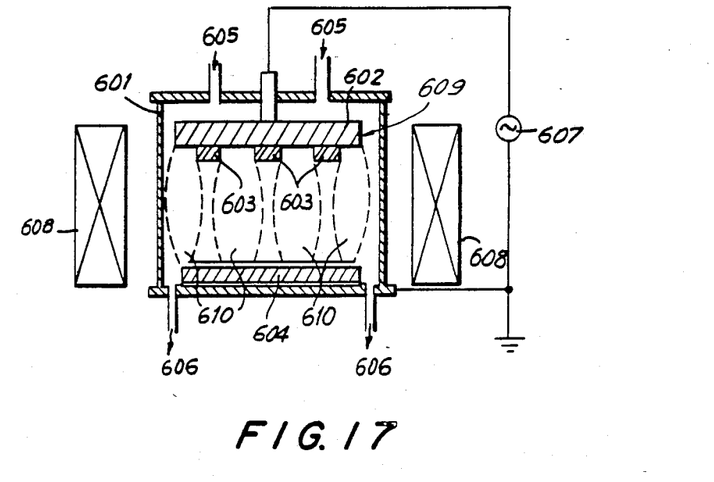
FIG. 17 is an ion beam exposure device constructed in accordance with another embodiment of the invention.

Reference is now made to FIG. 17 in which an ion beam exposure apparatus and the method for exposing a material in accordance with another embodiment of the invention is shown. Generally, in this ion beam exposure apparatus, a conductive surface is covered with an insulating film. By etching the insulating film into a pattern, the mask may be used as an electrode which permits generating beams in the form of the pattern. When a high frequency or DC voltage is applied to the electrode on which the conductive materials and patterned insulating film are provided and are then exposed to a lower pressure gas atmosphere, gas ions are generated. Ion beam exposure is then realized by projecting the patterned gas ions through a magnetic lens or an electric field-lens to the surface of the materials to be exposed.

Specifically, a vacuum chamber 601 is provided with an intake port 605 and an exhaust port 606. An insulating film 603 is placed on the front surface of a silicon substrate 602 in a pattern to form a mask 609 within chamber 601. A silicon wafer 604 is positioned opposite mask 609 within chamber 601. A gas such as hydrogen is introduced into vacuum chamber 601 through port 605. Simultaneously, an exhaust gas is removed by a vacuum pump at exhaust 606 in order to keep the pressure in chamber 601 low. A power source 607 applies power to both wafer 604 and mask 609. Irradiated ions can be projected at silicon wafer 604 with a magnet or electrostatic lens 608 disposed about chamber 601 between wafer 604 and mask 609. Lens 608 projects ions 610 towards wafer 604 while focusing the beam to have a pattern of the same size as the actual pattern of mask 603.

The mask material is not always a pattern insulating film on the conductive material. A metallic film formed in a pattern of an insulating material may also be used as a mask. Furthermore, when a mask and a wafer are marked for registration, holes may be made on the mask so that optical series for inspecting both the patterns of the mask and the wafer are provided. Additionally, a mask conductive material is not restricted to silicon. Other metallic materials such as stainless steel may be used.

Accordingly, an ion beam exposure apparatus constructed in accordance with the present invention as described above provides an ion beam exposure apparatus with high productivity as well as a mask which can be easily manufactured.

It will thus be seen that the objects set forth above, among those made apparent from the preceding description, are efficiently attained and, since certain changes may be made in carrying out the above process, in the described product, and in the construction set forth without departing from the spirit and scope of the invention, it is intended that all matters contained in the above description and shown in the accompanying drawings shall be interpreted as illustrative and not in a limiting sense.

It is also understood that the following claims are intended to cover all of the generic and specific features of the invention herein described and all statements of the scope of the invention which is a matter of language might be said to fall therebetween.

What is claimed is:

1. An ion beam gun for ionizing a gas comprising:
   gas supply means having an outlet port for supplying gas to be ionized;
   ion emission means including a thin film and means for applying a voltage to the thin film for emitting ions of the gas in the gas supply means, the ion emission means disposed on the outlet port of the gas supply means for emitting ions;
   the thin film being a thin plate with a pin hole and a second thin film for emitting the ions disposed on the gas supply side of the thin plate; and
   vacuum means for providing a vacuum on the ion emitting side of the emission means and for receiving the ions emitted by the ion emission means.

2. The ion beam gun of claim 1, wherein the thin film of the emission means is a thin film selected from the group consisting of palladium, titanium and tungsten.

3. The ion beam gun of claim 1, wherein the heating means applies an electrical field to the thin film.

4. The ion beam gun of claim 1, wherein the thin film is selected from the group consisting of palladium, titanium and tungsten.

5. The ion beam gun of claim 1, wherein the thin plate is monocrystalline silicon.

6. The ion beam gun of claim 1, wherein the thin film of the emitting means is a monocrystalline substrate having a detective crystal portion dislocation therein, the defect disposed over the outlet port of the supply means and sufficiently wide to allow the passage therethrough of a single particle to be ionized at a time.

7. The ion beam gun of claim 1, wherein the gas to be ionized is selected from the group consisting of hydrogen, helium and argon.

8. An ion beam gun for ionizing a gas comprising:
   gas supply means having an outlet port for supplying gas to be ionized;
   ion emission means including a thin film and means for applying a voltage to the thin film for emitting ions of the gas in the gas supply means, the ion emission means disposed on the outlet port of the gas supply means for emitting ions;
   the thin film being a thin plate with a superfine wire disposed in the plate, the superfine wire communicating with the outlet port; and
   vacuum means for providing a vacuum on the ion emitting side of the emission means and for receiving the ions emitted by the ion emission means.

9. The ion beam gun of claim 8, wherein the superfine wire is selected from the group consisting of palladium, titanium and tungsten.

10. The ion beam gun of claim 8, wherein the gas to be ionized is selected from the group consisting of hydrogen, helium and argon.

11. The ion beam of claim 8, wherein the thin film of the emission means is a thin film selected from the group consisting of palladium, titanium and tungsten.

12. The ion beam gun of claim 8, wherein an electrical field is applied to the thin film.

13. An ion beam gun for ionizing a gas comprising:
    gas supply means having an outlet port for supplying gas to be ionized;
    ion emission means including a thin film and means for applying a voltage to the thin film for emitting ions of the gas in the gas supply means, the ion emission means disposed on the outlet port o the gas supply means for emitting ions; the thin film being a monocrystalline silicon substrate and a superfine wire selected from the group consisting of palladium, titanium and tungsten is deposited within the substrate and communicates with the outlet port of the gas supply means; and
    vacuum means for providing a vacuum on the ion emitting side of the emission means and for receiving the ions emitting by the ion emission means.

14. The ion beam gun of claim 13, wherein the gas to be ionized is selected from the group consisting of hydrogen, helium and argon.

15. The ion beam of claim 13, wherein the thin film of the emission means is a thin film selected from the group consisting of palladium, titanium and tungsten.

16. The ion beam gun of claim 13, wherein an electrical field is applied to the thin film.

17. An ion beam gun for ionizing a gas comprising:
    gas supply means having an outlet port for supplying gas to be ionized;
    ion emission means including a thin film and means for applying a voltage to the thin film for emitting ions of the gas in the gas supply means, the ion emission means disposed on the outlet port of the gas supply means for emitting ions;
    the thin film being a monocrystalline substrate having a defective crystal portion dislocation therein, the defect disposed over the outlet port of the supply means and sufficiently wide to allow the passage therethrough of a single particle to be ionized at a time; and vacuum means for providing a vacuum on the ion emitting side of the emission means and for receiving the ions emitted by the ion emission means.

18. The ion beam gas of claim 17, wherein the gas to be ionized is selected from the group consisting of hydrogen, helium and argon.

19. The ion beam of claim 17, wherein the thin film of the emission means is a thin film selected from the group consisting of palladium, titanium and tungsten.

20. The ion beam gun of claim 17, wherein the gas to be ionized is selected from the group consisting of hydrogen, helium and argon.

21. An ion beam exposure mask comprising:
an ion emitting substrate
means for applying a voltage to the substrate for emitting ions; and
a nitride film selectively formed in a pattern of the ion emitting surface of the substrate, whereby the nitride film selectively permits passage of the ions in the form of the pattern of the nitride film.

22. The ion beam exposure mask of claim 21, wherein the ion emitting substrate is selected from the group consisting of palladium, titanium and tungsten.

23. The ion beam exposure mask of claim 21, wherein the nitride film is silicon nitride.

24. The ion beam exposure mask of claim 21, wherein the nitride film is a nitride of the material of which the substrate is formed.

25. An ion beam gun for ionizing a gas, comprising:
container means for holding the gas to be ionized, the container means including a gas inlet port and a vacuum port;
high voltage power means for generating a high voltage signal;
an ion beam pattern mask in the container coupled to the voltage power means for forming an ion emitting surface;
grid means in the container and spaced apart from and in cooperating with the pattern mask as a grid for ionizing the gas and transforming the gas into a plasma.

26. The ion beam gun of claim 25, wherein the ion emitting surface is a surface of the container means.

27. An ion beam exposure device for exposing a wafer to an ion beam produced from an ionized gas, comprising:
an insulating mask substrate positioned opposite to a wafer to be irradiated;
a conducting material formed in a pattern on the surface of the substrate facing the wafer; and
energizing means for energizing the conducting layer to emit ions in a pattern corresponding to the pattern of the conducting material; having a high frequency generator coupled to the conductive layer and the silicon wafer.

28. The ion beam exposure device of claim 27, further including a protective layer formed on the surface of the substrate over the pattern of conductive material.

29. The ion beam exposure device of claim 27, further including a projecting imaging lens means disposed between the substrate and the wafer for adjusting the width of the ion beam at the wafer so that the size of the ion beam pattern projected on the safe is the same as the size of the mask formed by the conductive layer.

30. The ion beam exposure device of claim 29, wherein the projecting lens means is an electrostatic lens disposed about the region between the substrate and the wafer.

31. The ion beam exposure device of claim 27, further including a vacuum chamber having a gas inlet port and a vacuum port, the substrate and wafer positioned in the chamber.

32. The ion beam exposure device of claim 27, wherein the conductive material is selected from the group consisting of chromium, tungsten and mesium.

33. The ion beam exposure device of claim 27, wherein the insulating layer is formed of quartz or glass.

34. The ion beam exposure device of claim 27, wherein the energizing means is violet rays projected through the insulating substrate towards the conducting layer and wafer.

35. An ion beam exposure device for exposing a wafer to an ion beam produced from an ionized gas, comprising:
an insulating mask substrate positionioned opposite to a wafer to be irradiated;
a conducting material formed in a pattern on the surface of the substrate facing the wafer;
energizing means for energizing the conducting layer to emit ions in a pattern corresponding to the pattern of the conducting material; and
a high frequency power means, for generating a high frequency signal, the high frequency power means being coupled to the pattern of conducting material on the substrate.

36. The ion beam exposure device of claim 35, wherein the conductive material is selected from the group consisting of chromium, tungsten and cesium.

37. The ion beam exposure device of claim 35, wherein the insulating layer is formed of quartz or glass.

38. The ion exposure device of claim 35, wherein the energizing means is ultraviolet rays projected through the insulating substrate towards the conducting layer and wafer.

39. The ion beam exposure device of claim 35, further including a protective layer formed on the surface of the substrate over the pattern of conductive material.

40. The ion beam exposure device of claim 35, further including a projecting imaging lens means disposed between the substrate and the wafer for adjusting the width of the ion beam the wafer so that the size of the ion beam pattern projected on the wafer is the same as the size of the mask formed by the conductive layer.

41. An ion beam gun for ionizing a gas comprising:
gas supply means having an outlet port for supplying gas to be ionized;
ion emission means including a thin film and heating means for heating the thin film for emitting ions of the gas in the gas supply means, the ion emission means disposed on the outlet port of the gas supply means for emitting ions;
the thin film being a thin plate with a superfine wire being disposed in the plate, the superfine wire communicating with the outlet port; and
vacuum means for providing a vacuum on the ion emitting side of the emission means and for receiving the ions emitted by the emission means.

42. An ion beam gun for ionizing gas comprising:
gas supply means having an outlet port for supplying gas to be ionized;
ion emission means including a thin film and means for applying a voltage to the thin film for emitting ions of the gas in the gas supply means, the ion emission means disposed on the outlet port of the gas supply means for emitting ions;
the thin film being a monocrystalline substrate having a grain crystal boundary formed therein, the crystal grain boundary being disposed over the outlet port of the gas supply means; and
vacuum means for providing a vacuum on the ion emitting side of the emission means for receiving the ion emitted by the ion emission means.

* * * * *